United States Patent
Strutz et al.

(10) Patent No.: US 9,728,493 B2
(45) Date of Patent: Aug. 8, 2017

(54) MOLD PACKAGED SEMICONDUCTOR CHIP MOUNTED ON A LEADFRAME AND METHOD OF MANUFACTURING THE SAME

(71) Applicant: Infineon Technologies AG, Neubiberg (DE)

(72) Inventors: Volker Strutz, Tegernheim (DE); Rainer Schaller, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/839,013

(22) Filed: Aug. 28, 2015

(65) Prior Publication Data

US 2017/0062312 A1    Mar. 2, 2017

(51) Int. Cl.
   *H01L 23/48*      (2006.01)
   *H01L 23/52*      (2006.01)
   *H01L 29/40*      (2006.01)
   *H01L 23/495*     (2006.01)
   *H01L 21/56*      (2006.01)
   *H01L 23/31*      (2006.01)

(52) U.S. Cl.
   CPC ...... *H01L 23/49541* (2013.01); *H01L 21/561* (2013.01); *H01L 23/3114* (2013.01); *H01L 2224/32245* (2013.01); *H01L 2924/181* (2013.01)

(58) Field of Classification Search
   CPC ......... H01L 2224/4847; H01L 23/3107; H01L 24/45; H01L 24/97; H01L 23/49541; H01L 21/561; H01L 23/3114; H01L 27/0722; H01L 27/0647

See application file for complete search history.

(56) References Cited

U.S. PATENT DOCUMENTS

| | | | | |
|---|---|---|---|---|
| 4,862,245 A | * | 8/1989 | Pashby | H01L 23/495 228/180.5 |
| 6,579,399 B1 | * | 6/2003 | Hamren | H01L 21/6835 156/232 |
| 7,262,511 B2 | * | 8/2007 | Osako | H01L 24/29 252/512 |
| 7,800,241 B2 | * | 9/2010 | Bauer | H01L 23/3142 257/783 |
| 8,354,741 B2 | * | 1/2013 | Kang | H01L 21/4832 257/672 |
| 2007/0222087 A1 | * | 9/2007 | Lee | H01L 23/04 257/784 |
| 2012/0248591 A1 | * | 10/2012 | Kure | H01L 23/49582 257/676 |
| 2013/0029432 A1 | * | 1/2013 | Motz | G01R 15/202 438/3 |

* cited by examiner

*Primary Examiner* — Thomas L Dickey
*Assistant Examiner* — Damon Hillman
(74) *Attorney, Agent, or Firm* — Murphy, Bilak & Homiller, PLLC (57) ABSTRACT

A semiconductor device package includes a leadframe and a semiconductor chip mounted to the leadframe. The semiconductor device package further includes a molded encapsulant configured to cast-in-place the leadframe. A surface area of the leadframe remains exposed by the encapsulant. An electrically insulating covering layer extends over a part of the surface area and is configured to divide the surface area in at least two zones.

20 Claims, 5 Drawing Sheets

MOLD PACKAGED SEMICONDUCTOR CHIP MOUNTED ON A LEADFRAME AND METHOD OF MANUFACTURING THE SAME

TECHNICAL FIELD

This invention relates generally to the technique of electronic device packaging, and in particular to the technique of mold packaging a semiconductor chip mounted on a leadframe.

BACKGROUND

Electronic device manufacturers are constantly striving to increase the performance of their products, while decreasing their cost of manufacture. A cost intensive area in the manufacture of electronic device packages is packaging the electronic component(s), e.g. semiconductor chip(s). Thus, electronic device packages and methods of manufacturing the same at low expenses and high yield are desirable. Additionally, semiconductor device packages are desired which allow the package to be easily and reliably electrically connected to external circuitry, such as a printed circuit board. In this respect, input/output contact terminals of the package promoting connectivity and design variability may be under consideration.

For these and other reasons, it may be desirable to provide for a semiconductor device package and a method of packaging a semiconductor chip which improve one or more of the above shortcomings.

BRIEF DESCRIPTION OF THE DRAWINGS

The accompanying drawings are included to provide a further understanding of embodiments and are incorporated in and constitute a part of this specification. The drawings illustrate embodiments and, together with the description, serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

In the following detailed description, reference is made to the accompanying drawings, which form a part thereof, and in which is shown by way of illustration specific embodiments in which the invention may be practiced. In this regard, directional terminology, such as "top", "bottom", "front", "back", "upper", "lower", etc., is used with reference to the orientation of the Figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other unless specifically noted otherwise.

Further, as employed in this specification, the terms "bonded", "attached", "connected", "coupled" and/or "electrically connected/electrically coupled" are not meant to mean that the elements or layers must directly be contacted together; intervening elements or layers may be provided between the "bonded", "attached", "connected", "coupled" and/or "electrically connected/electrically coupled" elements, respectively. However, in accordance with the disclosure, the above-mentioned terms may, optionally, also have the specific meaning that the elements or layers are directly contacted together, i.e. that no intervening elements or layers are provided between the "bonded", "attached", "connected", "coupled" and/or "electrically connected/electrically coupled" elements, respectively.

Further, the words "over" or "above" used with regard to a part, element or material layer formed or located "over" or "above" a surface may be used herein to mean that the part, element or material layer be located (e.g. placed, formed, deposited, etc.) "directly on", e.g. in direct contact with, the implied surface. The words "over" or "above" used with regard to a part, element or material layer formed or located "over" or "above" a surface may be used herein to mean that the part, element or material layer be located (e.g. placed, formed, deposited, etc.) "indirectly on" the implied surface with one or more additional parts, elements or layers being arranged between the implied surface and the part, element or material layer. The same applies analogously to the terms or "under", "below", "beneath", etc.

The semiconductor device packages described herein contain one or more semiconductor chip(s). The semiconductor chip(s) may be manufactured by various technologies and may include, for example, integrated electrical, electro-optical, or logical circuits, switches, antennas, and/or passives. In particular, a semiconductor chip contained in the package may be a sensor chip. The sensor chip may, e.g., comprise a magnetic field sensitive element and/or a voltage sensing circuitry (e.g. voltage detector).

The semiconductor device packages described herein are molded packages. As such, they comprise an encapsulant in which the semiconductor chip is embedded. The encapsulant is made of mold material such as, e.g., an electrically insulating thermoset material or a thermoplastic material. More specifically, the mold material may comprise or be at least one of a filled or unfilled mold material, a filled or unfilled thermoplastic material, or a filled or unfilled thermoset material. A thermoset material may, e.g., be made on the basis of an epoxy resin or an acrylic resin. A thermoplastic material may, e.g., comprise one or more materials selected from the group of polyetherimide (PEI), polyethersulfone (PES), polyphenylene-sulfide (PPS), polyamide-imide (PAI), and polyethylene-terephthalate (PET). Thermoplastic materials melt by application of pressure and heat during molding and (reversibly) harden upon cooling and pressure release. Resin types of the mold material may include, e.g., cyanate ester, BMI (bismaleimide), epoxy-polyimide, epoxy-silicone, epoxy, silicone (hard type). Filler materials may include, e.g., $SiO_2$, $Al_2O_3$, BrN, AlN, etc.

Various techniques such as, e.g., transfer molding, compression molding, transfer and compression molding (both using, e.g. pellets, granulate, liquid or sheets, etc.), or injection molding may be used to form the encapsulant embedding the semiconductor chip. All these techniques may employ film-assisted molding (FAM), in particular top and/or bottom side FAM, and/or vacuum molding.

The semiconductor device packages described herein are leadframe packages. As such, a semiconductor device package comprises a leadframe as a chip carrier. The leadframe may comprise one or multiple metal plates such as, e.g., one or more die pads and one or more terminal pads. A die pad serves as a chip carrier, i.e. as a chip pad. The terminal pads form external package terminals for electrically connecting the package to an external application. The leadframe (i.e. the metal plates thereof) may be made of any metal or metal alloy, e.g. one or more metal material selected from the group consisting of copper, iron, molybdenum, etc. or any alloys or composites thereof.

The encapsulant may embed the semiconductor chip and casts-in-place the leadframe. That is, the leadframe may be subjected as an inlay part to the molding process and at least a part of the surface of the leadframe is covered by the molding material and thereby fixedly secured to the encapsulant.

By way of example, such leadframe may be used to provide for a leaded chip carrier having leads protruding out of the encapsulant and forming external terminal contacts of the package. By way of example, such leaded chip carrier may be a PLCC (Plastic Leaded Chip Carrier) or QFJ (Quad Flat J-Leaded) chip carrier. Leads may protrude out of the encapsulant at only one side of the package or at a plurality of sides thereof, e.g. at two opposite sides. The chip carrier may also be a leadless chip carrier such as, e.g., a so-called TSLP- (Thin Small Leadless Package-) carrier. Examples for leadless packages/chip carriers configured as SMDs (Surface Mounted Devices) are, e.g., QFN (Quad Flat No-Leads), SO (Small Outline), e.g., SO8 (Small Outline 8 Pins), SSO (Stacked SO), e.g., SSO8 (Stacked SO 8 Pins) and TOLL (TO Leadless). Leadframes used as leadless chip carriers may have chip pads and/or terminal pads exposed by the encapsulant and forming external terminal contacts of the package.

It is to be noted that molded leadframe packages as described herein are typically one of the most simple and low cost package types available. Therefore, any improvement of such packages towards better reliability, functionality and/or versatility may be highly beneficial since it may open the possibility to get around the requirement to use more sophisticated and expensive packages.

Figure 1:
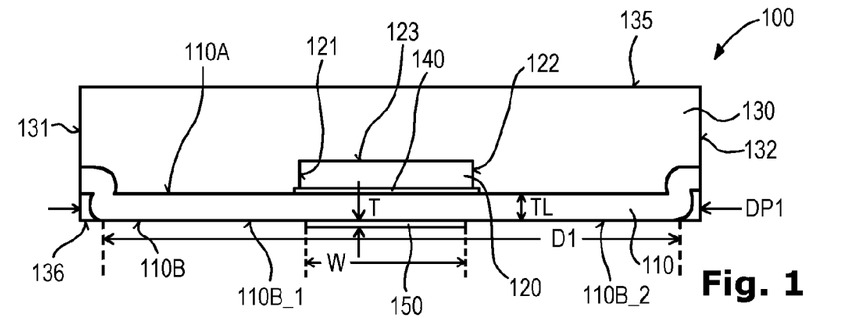
FIG. 1 schematically illustrates a sectional view along line A-A of FIG. 2 of an exemplary semiconductor device package having a leadframe and a covering layer extending over a part of the leadframe to define leadframe terminal contacts.

FIG. 1 illustrates a sectional view of an exemplary semiconductor device package 100. The semiconductor device package 100 comprises a leadframe 110, a semiconductor chip 120 and a molded encapsulant 130. The semiconductor chip 120 is mounted to the leadframe 110. The molded encapsulant 130 is configured to cast-in-place the leadframe 110.

The leadframe 110 has a first main surface 110A and a second main surface 110B opposite the first main surface 110A. The semiconductor chip 120 may be mounted to the first main surface 110A of the leadframe 110. By way of example, the semiconductor chip 120 may be bonded to the first main surface 110A of the leadframe 110 by a bond material 140 arranged between the leadframe 110 and the semiconductor chip 120. The bond material 140 may, e.g., be an insulating material such as, e.g., an adhesive or glue or an adhesive plastic or ceramic plate or an adhesive tape. The semiconductor chip 120 may be electrically insulated from the leadframe 110 by the bond material 140. The layer of insulating bond material 140 may provide for a vertical dielectric strength (measured in the direction of the thickness of the bond material layer) equal to or greater than 5 kV/mm, 20 kV/mm, 50 kV/mm, 100 kV/mm or 250 kV/mm. In other examples, the semiconductor chip 120 may be electrically connected to the leadframe 110 by the bond material 140. In this case, the bond material 140 may be an electrically conducting material such as, e.g., a soldering material, a sintering material or an electrically conducting polymer material.

The second main surface 110B of the leadframe 110 is at least partially exposed by the molded encapsulant 130. That is, as will be explained in more detail further below, the second main surface 110B comprises an area which is exposed (i.e. not covered) by the encapsulant 130.

Figure 2:
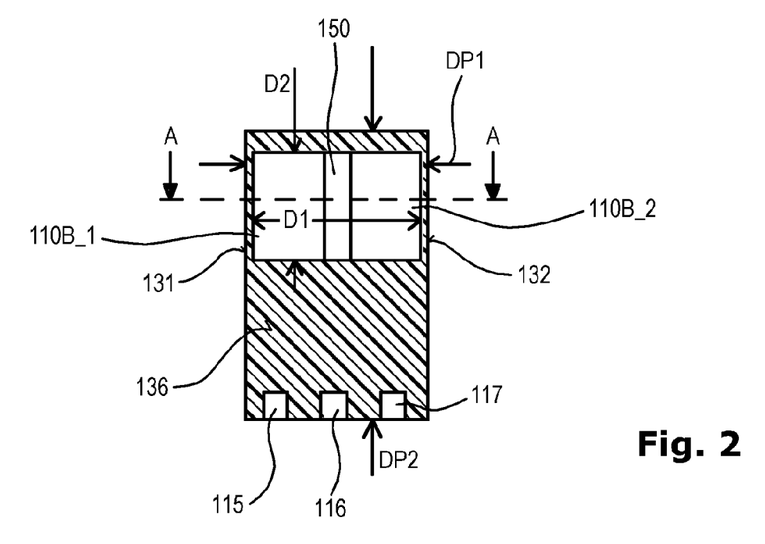
FIG. 2 schematically illustrates a bottom view of the exemplary semiconductor device package of FIG. 1.

Further referring to FIG. 2, the exposed surface area of the second main surface 110B of the leadframe 110 may have a first lateral dimension D1 and a second lateral dimension D2. As illustrated in FIG. 2, the first lateral dimension D1 may, e.g., be equal to or greater than 50%, 60%, 70%, 80%, 90%, of the lateral dimension DP1 of the semiconductor device package 100 as measured from a side wall surface 131 to an opposite side wall surface 132 of the molded encapsulant 130. In other words, referring to the lateral dimension D1, the major part of the second main surface 110B of the leadframe 110 may contribute to the exposed surface area.

Referring to the lateral dimension D2, which extends in a direction perpendicular to the lateral dimension D1, the lateral dimension D2 of the exposed surface area of the leadframe 110 may also contribute to equal to or more than 50%, 60%, 70%, 80%, or 90% of the corresponding dimension of the second main surface 110B of the leadframe 110.

However, as illustrated in FIG. 2, D2 may, e.g., be significantly smaller than the corresponding dimension DP2 of the semiconductor device package 100 as measured between the side walls surfaces 133 and 134 of the molded encapsulant 130. By way of example, D2 may be equal to or less than 80%, 70%, 60%, 50%, 40%, 30%, 20%, or 10% of DP2.

FIG. 1 may illustrate a sectional view along line A-A of FIG. 2. As illustrated in FIG. 2, the exposed surface area of the second main surface 110B of the leadframe 110 may be completely surrounded or framed by the encapsulant 130. That way, the lower edge of the semiconductor device package 100 may be formed by the electrically insulating mold material of the molded encapsulant 130.

As illustrated in FIG. 1, the molded encapsulant 130 may embed the semiconductor chip 120. In particular, all side faces 121, 122 and the top face 123 of the semiconductor chip 120 may be partly or completely covered by the molded encapsulant 130. Further, a top surface 135 of the molded encapsulant 130 may define a periphery of the semiconductor device package 100. A bottom surface 136 of the molded encapsulant 130 may lie in the same plane as the exposed area of the second main surface 110B of the leadframe and may also define a periphery of the semiconductor device package 100. That is, the encapsulant 130 may at least partly (e.g. top surface and/or side wall surfaces) define the outer shape of the semiconductor device package 100. More specifically, the top surface 135, the bottom surface 136, the side wall surfaces 131-134 of the encapsulant 130 and the exposed surface area of the second main surface 110B of the leadframe 110 may form peripheral faces of the semiconductor device package 100.

In other embodiments the semiconductor chip 120 is not embedded in the encapsulant 130. In these embodiments, the encapsulant 130 may be shaped (e.g. molded) to have a cavity (not shown), and the semiconductor chip 120 is placed into this cavity and mounted to the first main surface 110A of the leadframe 110. In these cases, the semiconductor chip 120 may be mounted to the leadframe 110 after the encapsulant has been molded to the leadframe 110. Further, while in some cases the package-internal electrical interconnect (not shown) of the semiconductor chip 120 may be completed before molding of the encapsulant 130 in the semiconductor device package 100, if a molded encapsulant 130 having a cavity for inserting the semiconductor chip 120 is used, the package-internal electrical interconnect (not shown) of the semiconductor chip 120 to the leadframe 110, e.g. to pads of the leadframe 110 forming package terminal contacts 115, 116, 117, may be fabricated after molding the encapsulant 130.

The semiconductor device package 100 further comprises an electrically insulating covering layer 150 extending over a part of the exposed surface area of the second main surface 110B of the leadframe 110. The electrically insulating covering layer 150 is configured to divide the exposed surface area in at least a first zone 110B_1 and a second zone 110B_2. Thus, the first zone 110B_1 and the second zone 110B_2 may be geometrically defined by the outline of the electrically insulating covering layer 150 and, e.g., by the exposed surface area of the leadframe 110.

As will be explained in more detail further below, the first zone 110B_1 and the second zone 110B_2 are defined to form external terminal contacts of the semiconductor device package 100. By way of example, the first zone 110B_1 may form an input (I) terminal contact and the second zone 110B_2 may form an output (O) terminal contact of the semiconductor device package. The input/output (I/O) terminal contacts may, e.g., be used as I/O current path contacts through which a current is input to and output from the semiconductor device package 100. The semiconductor device package 100 may comprise a current sensor to sense or measure the current input/output via the first zone 110B_1 and the second zone 110B_2 of the exposed surface area of the leadframe 110. Thus, the leadframe 110 may serve as a current rail for the current sensor included in the semiconductor device package.

The covering layer 150 may be configured to completely travers the exposed surface area of the second main surface 110B of the leadframe 110 in at least one lateral dimension, e.g. in lateral dimension D2 as exemplified in FIG. 2. That way, the first zone 110B_1 and the second zone 110B_2 are disconnected or discontiguous areas separated from each other by the covering layer 150.

A portion of the covering layer 150, which traverses the exposed surface area of the second main surface 110B of the leadframe 110, may have the shape of a strip, see, e.g., FIG. 2. As will be explained further below, the portion of the covering layer traversing the exposed surface area may also have a shape of a cross or a mesh. In these cases it is possible to divide the exposed surface area of the second main surface 110B of the leadframe 110 in more than two zones, e.g. in a number of n, n=3, 4, 5, 6 . . . , distinct zones. That way, it is possible to define more than one I/O terminal contact pair of the semiconductor device package 100.

The covering layer 150 may have a maximum thickness T of equal to or greater than or less than 30 μm, 20 μm, 10 μm, or 5 μm. A portion of the covering layer 150 which traverses the exposed surface area may, e.g., have a width W of equal to or greater than or less than 50 μm, 70 μm, 90 μm, 110 μm, 150 μm, 200 μm, 300 μm, 400 μm, 500 μm, 600 μm, . . . , 1 mm, or 1.5 mm. The width W may be chosen to correspond to a desired length of a current measurement path of the leadframe 110. By way of example, the width W may correspond to a defined electrical resistance of the leadframe 110. By way of example, by knowing this electrical resistance of the leadframe 110 along the width W and by measuring the voltage drop across the width W experienced by a current flowing the length W through the leadframe 110, the current may be determined based on the measured voltage drop.

Figure 3:
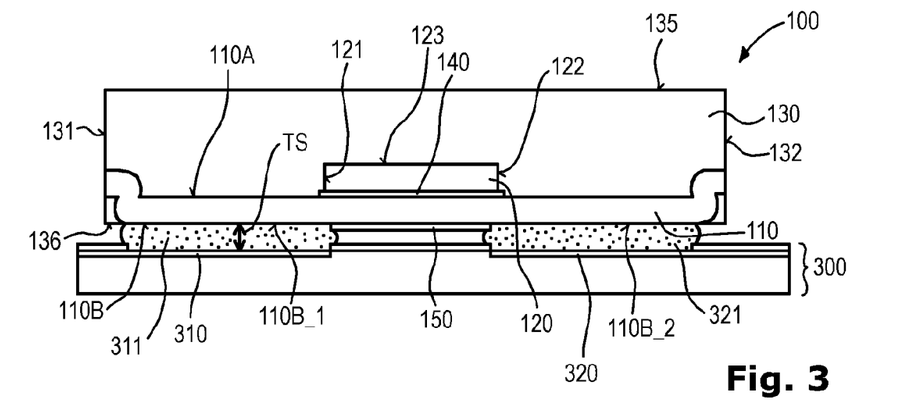
FIG. 3 schematically illustrates a sectional view of the exemplary semiconductor device package of FIG. 1 when mounted to an application board.

The width W may also define the distance or spacing between the input terminal contact and the output terminal contact of the semiconductor device package 100 when mounted to an application board 300 as illustrated in FIG. 3. The application board 300, e.g. a PCB (printed circuit board) or another substrate such as, e.g., a ceramic substrate or a semiconductor substrate (e.g. another semiconductor chip) may comprise an input pad 310 to be connected to the first zone 110B_1 of the leadframe 110 and an output pad 320 to be connected to the second zone 110B_2 of the leadframe 110. By way of example, a first solder joint 311 is used to electrically connect the input pad 310 to the first zone 110B_1 of the leadframe 110 and a second solder joint 321 is used to electrically connect the output pad 320 to the second zone 110B_2 of the leadframe 110. The first solder joint 311 and the second solder joint 321 may each have a thickness TS of equal to or greater than or less than 25 μm, 40 μm, 55 μm, 70 μm, 85 μm, or 100 μm.

The first and second solder joints 311, 321 may be formed by a reflow process, e.g. during surface mounting the semiconductor device package 100 to the application board 300. During the reflow process the covering layer 150 may act as a solder stop layer. In other words, the location and/or geometry of the I/O terminal contacts of the semiconductor device package 100 may be defined by the covering layer 150 and therefore, in particular, by the width W of the covering layer 150. For instance, increasing the width W of the covering layer 150 results in spacing the I/O terminal contacts of the semiconductor device package 100 further apart. Thus, the shape and/or the outline of the covering layer 150 are used to define the geometry or pattern of the I/O terminal contacts of the semiconductor device package 100.

The covering layer 150 is made of an electrically insulating material. By way of example, the material of the covering layer 150 may be selected from the group consisting of a paint, an ink, a solder resist, a ceramic, a polymer, a polyimide, a silicate, and an epoxy, in particular a wafer level epoxy. It may be applied, e.g., by printing, laminating (of a tape), spraying, etc.

It is to be noted that the covering layer 150 is not fabricated by the molding process to form the molded encapsulant 130. Rather, the covering layer 150 may be applied after the encapsulation molding process. This allows for a high flexibility and geometrical variability in defining the I/O terminal contacts of the semiconductor device package 100 by appropriately shaping the covering layer 150 and thus the first zone 110B_1 and the second zone 110B_2. Further, the application of the covering layer 150 after the molding process is less expensive than any specific measures which would otherwise be needed to define the I/O terminal contacts of the package, e.g. in-mold back injection, leadframe shaping, etc.

In all embodiments described herein it is possible to use a leadframe 100 which may be planar over, e.g., the entire exposed surface area. At least, the leadframe 100 may be planar between the first and second zones 110B_1 and 110B_2, e.g., may not have any shaped or bent portions between these zones 110B_1, 110B_2 or over the entire exposed surface area. Further, the leadframe 110 may have a constant thickness TL across, e.g., the entire exposed surface area or at least across the region in which the exposed surface area is covered by the covering layer 150. In other words, it may not be necessary to shape the leadframe 110 by bending, thinning or any other process across the exposed surface area and/or in the region covered by the covering layer 150. That way, leadframe shaping processes such as, e.g., etching, milling, stamping, bending or deep-drawing to bring the leadframe in an appropriate shape for defining and/or forming the I/O package terminal contacts by molding may be omitted.

It is to be noted that the possibility of using a leadframe 110 having a planar shape across the exposed surface area of the leadframe 110 (or at least across the region covered by the covering layer 150) may improve the reliability and precision of the semiconductor device embodied in the semiconductor device package 100. By way of example, if the semiconductor device package 100 comprises a current sensor, the current to be measured flows through the region of the leadframe 110 covered by the insulating covering layer 150. As this region of the leadframe 110 may not have been subjected to bending, reshaping or, e.g., other types of machining, the mechanical stability and electrical conductivity of this region are unimpaired and well defined. In particular, it may be avoided that bending areas or thinning zones are created in the leadframe 110 which could increase component tolerances and/or decrease reproducibility of the sensing or measuring function of the device.

By way of example, the semiconductor chip 120 may comprise a magnetic field sensitive element. The magnetic field sensitive element may be located over the region of the leadframe 110 which is covered by the covering layer 150. Thus, by sensing the magnetic field created by the current flowing from the first zone 110B_1 to the second zone 110B_2 of the leadframe 110, the current may be sensed or measured.

Alternatively or additionally, the semiconductor chip 120 may comprise a voltage sensing circuitry configured to sense a voltage drop across the region of the leadframe 110 which is covered by the covering layer 150. That is, a voltage difference between the first zone 110B_1 and the second zone 110B_2 of the leadframe 110 may be measured. The current may then be determined based on the measured voltage drop.

The leadframe 110 may have a thickness TL of equal to or greater than or less than 100 µm, 150 µm, 200 µm, 300 µm, 400 µm, or 500 µm. The lateral dimensions of the package, i.e. DP1 and/or DP2, may be equal to or greater than or less than 0.3 mm, 0.5 mm, 0.75 mm, 1 mm, 1.5 mm, 2 mm, 3 mm, 4 mm, 5 mm, or 10 mm.

Figure 4:
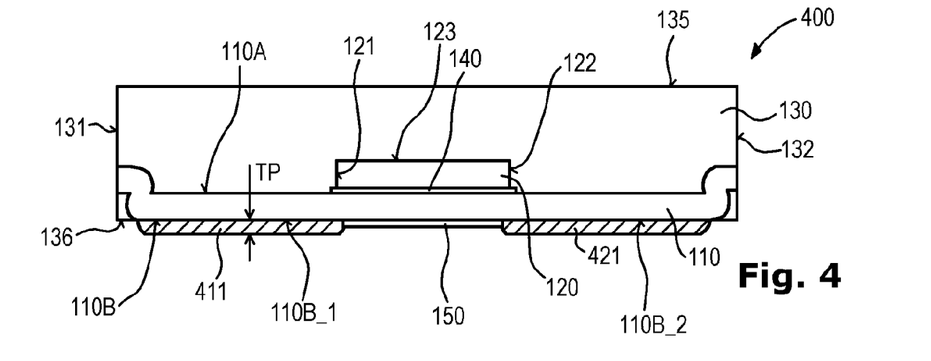
FIG. 4 schematically illustrates a sectional view along line A-A of FIG. 6 of an exemplary semiconductor device package having metal plating layers applied to the leadframe terminal contacts.

FIG. 4 illustrates a sectional view of an exemplary semiconductor device package 400. The sectional view of FIG. 4 may be taken along line A-A of FIG. 6. The semiconductor device package 400 may be similar or identical to semiconductor device package 100 except that a first metal plating layer 411 is configured to cover the first zone 110B_1 of the leadframe 110 and a second metal plating layer 421 is configured to cover the second zone 110B_2 of the leadframe 110. The first and second metal plating layers 411, 421 are laterally separated from each other by the covering layer 150. Thus, during application of the first and second metal plating layers 411, 421, the covering layer 150 may act as a plating stop layer preventing that plating metal is deposited over the covering layer 150 and thus preventing that the first metal plating layer 411 and the second metal plating layer 421 may be interconnected by plating metal. In contrast, the first metal plating layer 411 and the second metal plating layer 421 may be insular. They may be electrically connected to each other (only) via the leadframe 110 bridging the first and second metal plating layer 411, 421, more specifically by the portion of the leadframe 110 which is covered by the covering layer 150.

The thickness TP of each of the first and second metal plating layers 411, 421 may be equal to or less than or greater than 5 µm, 7 µm, 9 µm, 11 µm, 13 µm, 15 µm, or 20 µm. The metal plating layers 411, 421 may be made of a Sn metal or a metal alloy based on Sn. The first and second metal plating layers 411, 421 facilitate the process of surface mounting the semiconductor device package 400 to an application board 300 by, e.g., reflow soldering. Further, the first and second metal plating layers 411, 421 may serve to protect the second main surface 110B of the leadframe 110 against environmental attack such as, e.g., against oxidation.

Figure 5:
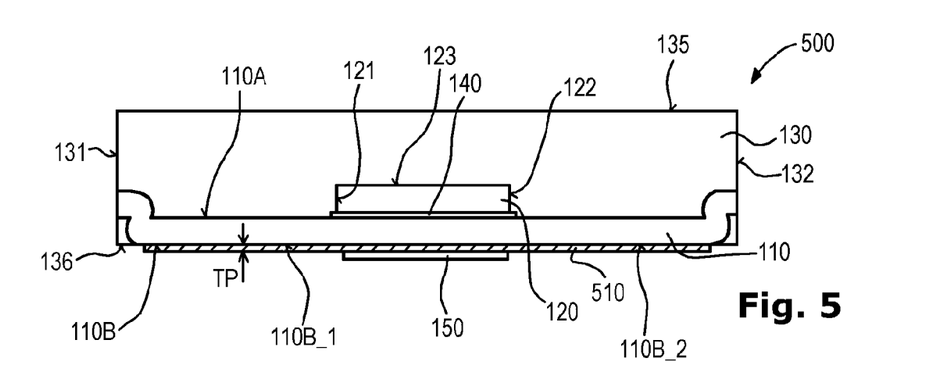
FIG. 5 schematically illustrates a sectional view along line A-A of FIG. 6 of an exemplary semiconductor device package having a metal plating layer arranged between the leadframe and a covering layer.

FIG. 5 illustrates a sectional view of an exemplary semiconductor device package 500. The sectional view of FIG. 5 may be taken along line A-A of FIG. 6, i.e. the bottom views of semiconductor device package 400 and semiconductor device package 500 may be identical.

Semiconductor device package 500 may be similar or identical to semiconductor device package 100 except that a common plating layer 510 is arranged between the exposed surface area of the leadframe 110 and the cover layer 150. The common metal plating layer 510 may have the same thickness TP and may be made of the same material as the first and second metal plating layers 411, 421 of FIG. 4. The common metal plating layer 510 may cover both the first and the second zones 110B_1, 110B_2 of the leadframe 110 and the region of the leadframe 110 between the first zone 110B_1 and the second zone 110B_2 (i.e. the region which is covered by the covering layer 150). The common metal plating layer 510 may be a continuous layer and may, e.g., cover the entire exposed surface area of the leadframe 110. The covering layer 150 may be directly applied onto the surface of the common metal plating layer 510 which faces away from the leadframe 110. In the embodiment of FIG. 5, the covering layer 150 does not act as a metal plating stop layer, since the common metal plating layer 510 is applied before the application of the electrically insulating covering layer 150. However, analogously to the embodiment of FIG. 4, the geometry and location of the covering layer 150 defines the geometries and locations of the first and the second zones 110B_1, 110B_2 or, stated differently, of the I/O terminal contacts of the semiconductor device package 500. Reference is made to the above description to avoid reiteration. Thus, in general, the covering layer 150 may serve to protect the covered portion(s) of the underlying conducting layer (e.g. leadframe 110 (see e.g. FIG. 1) or of the common metal plating layer 510 (see e.g. FIG. 5)) from being wetted during the board attach process (e.g. reflow process) and, as wetting is only possible in the uncovered portion(s) of the underlying conducting layer (e.g. leadframe 110 or common metal plating layer 510), defines package I/O terminal pad areas (the I/O terminal contacts) and creates an I/O path through the semiconductor device package 100, 400, 500.

Figure 6:
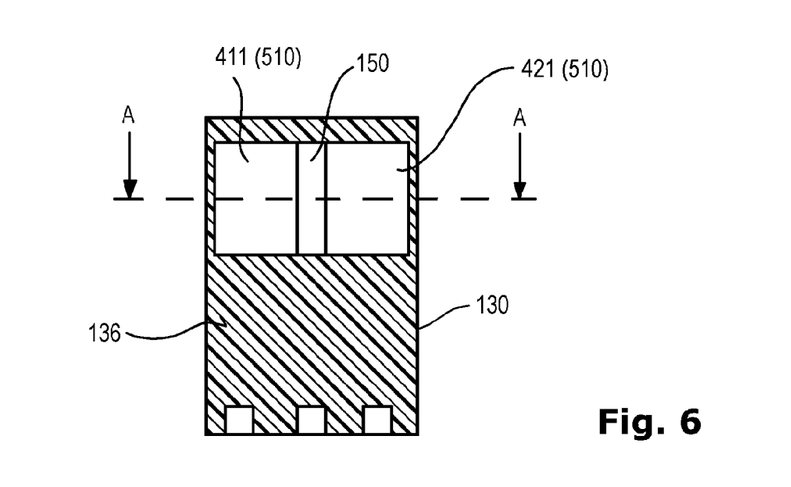
FIG. 6 schematically illustrates a bottom view of the exemplary semiconductor device packages of FIGS. 4 and 5.

FIG. 6 illustrates a bottom view of the semiconductor device packages 400 and 500. As it is apparent from FIG. 6, the first zone 110B_1 and the second zone 110B_2 of the leadframe 110 may be completely covered by the plating metal. The covering layer 150, on the other hand, remains uncovered by plating metal. Further, the package terminal contacts 115, 116 and 117 may also be covered by plating metal.

Figure 7A:
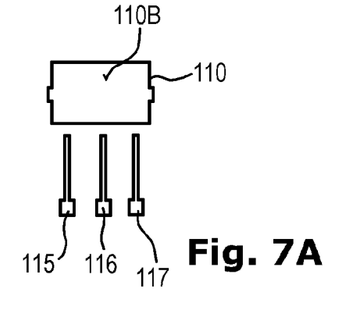
FIGS. 7A-7C schematically illustrate an embodiment of a method of manufacturing a semiconductor device package by showing bottom views of the semiconductor device package during various stages of the manufacturing process.
Figure 7B:
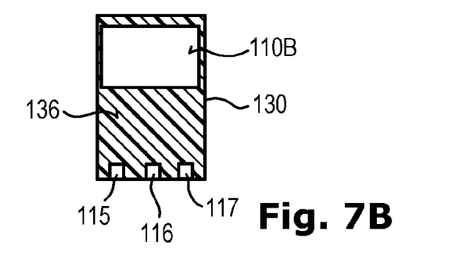
Figure 7C:
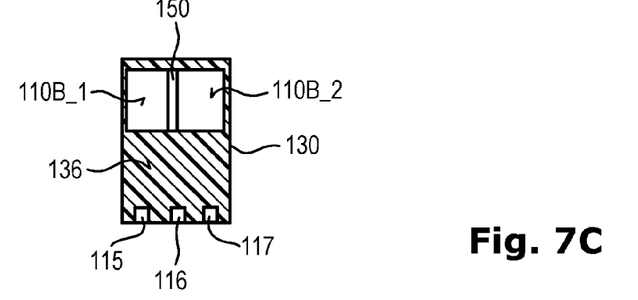

FIGS. 7A-7C illustrate bottom views of semiconductor device package 100 at different stages of an exemplary manufacturing process. As semiconductor device package 100 forms the basis of semiconductor device package 400 and semiconductor device package 500, the following description also applies to the processes of manufacturing the semiconductor device packages 400 and 500.

Referring to FIG. 7A, a leadframe 110 is provided. In FIG. 7A the bottom side (second main surface 110B) of the leadframe 110 is shown. The leadframe 110 may, e.g., be a full thickness leadframe 110 without any thinned region(s) at the exposed surface area thereof. Further, the leadframe 110 may comprise the package terminal contacts 115, 116, 117.

According to one possible manufacturing process, the semiconductor chip 120 is then mounted to the first main surface 110A of the leadframe 110. Electrodes of the semiconductor chip 120 may be connected via an internal package interconnect, e.g. wire bonds, (not shown) to the package terminal contacts 115, 116, 117. Further, the semiconductor chip 120 may have I/O electrodes which may be electrically connected to the first main surface 110A of the leadframe 110 at locations opposite to the first zone 110B_1 and the second zone 110B_2, respectively. The connection of I/O electrodes (not shown) of the semiconductor chip 120 to the at least two zones 110B_1, 110B_2 may also be provided by wire bonds or other appropriate electrical interconnect. By way of example, the semiconductor chip 120 may comprise a voltage sensing circuitry configured to sense a voltage drop between the at least two zones 110B_1, 110B_2. On the other hand, it is possible that the semiconductor chip 120 may comprise a magnetic field sensitive element. In this case, the semiconductor chip 120 may not need to have I/O electrodes, because the electrical current flowing through the leadframe 110 may be sensed and/or measured by the magnetic field created by the current.

Referring to FIG. 7B, a molded encapsulant 130 is applied by any appropriate molding technique. The encapsulant 130 may, e.g., form the periphery of the semiconductor device package 100 except of the exposed terminal contact of the leadframe 110, e.g. the exposed surface area of the second main surface 110B of the leadframe 110 and, optionally, the package terminal contacts 115, 116, 117. In particular, the semiconductor chip 120 and the internal electrical interconnect (not shown) may be completely embedded and covered by the encapsulant 130.

As mentioned before, it is also possible that the molding process may be performed before mounting the semiconductor chip 120 to the leadframe 110. In this case, the encapsulant 130 may be configured to have an opening or cavity which exposes a part of the first main surface 110A of the leadframe 110 and in which the semiconductor chip 120 may be placed and mounted.

After molding the encapsulant 130, the exposed surface area of the second main surface 110B of the leadframe 110 may form a continuous leadframe surface at the bottom (footprint) of the semiconductor device package 100. The bottom surface 136 of the molded encapsulant 130 may be coplanar with the exposed surface area of the second main surface 110B of the leadframe 110. The first and second zones 110B_1, 110B_2 thereof, which later on will constitute the I/O terminal contacts of the package, are still undefined at this stage of the manufacturing process.

Referring to FIG. 7C, the covering layer 150 is then applied. The application of the covering layer 150 defines the first and second zones 110B_1, 110B_2. The covering layer 150 may be applied by printing, dispensing, laminating, etc. an ink, a paint, a glue, or a tape onto the region of the leadframe 110 to be covered. As mentioned above, the application of the covering layer 150 is performed after the molding process is completed. The material of the covering layer 150 may be different from the mold material forming the molded encapsulant 130. By way of example, a silicate, epoxy, polymer, or polyimide material may be used for the covering layer 150.

The manufacturing process may then be continued by a plating step to arrive at the semiconductor device package 400 as illustrated in FIG. 4. That is, after the application of the electrically insulating covering layer 150, a first metal plating layer 411 is plated over the first zone 110B_1 and a second metal plating layer 421 is plated over the second zone 110B_2. During the plating process the covering layer 150 prevents plating metal to be deposited over the covered region of the leadframe 110. The plating process may, e.g., be performed by galvanic plating or electroless plating. The covering layer 150 needs to be resistant or stable against the chemistry used for plating.

The process of manufacturing a semiconductor device package may be subjected to variations. By way of example, in case that the semiconductor device package 500 is to be manufactured, the covering layer 150 is applied after the plating process. Plating may be performed the same way as described above with reference to FIG. 4. However, during the plating process, the first and second zones 110B_1 and 110B_2, respectively, are still undefined. Only after the plating process is completed, the covering layer 150 is applied and the multi-pad geometry of the terminal contacts is thus defined.

If the covering layer 150 is applied after plating (see, e.g., semiconductor device package 500 of FIG. 5), the common metal plating layer 510 should be rather thin, e.g., could have a thickness TL in a range between 5 and 15 µm. The smaller the thickness TL of the common metal plating layer 510, the smaller will be the degree of melting of the common metal plating layer 510 at the interface between the covering layer 150 and the second main surface 110B of the leadframe 110. Such melting of the common metal plating layer 510 near the edges of the covering layer 150 may, e.g., occur during the reflow process for soldering the semiconductor device package 500 to an application board 300. A creeping of re-melted plating metal beneath the covering layer 150 should be avoided or kept as low as possible, because it could impair the quality of the geometrical definition of the I/O terminal contacts by the covering layer 150.

Further, for the same reasons as stated above, it may be appropriate for semiconductor device package 500 to have the width W of the covering layer 150 equal to or greater than 100 µm. The greater the width W, the less significant is any creepage of the plating material beneath the edges of the covering layer 150 during subsequent reflow processes such as, e.g., during surface mounting (SM) of the semiconductor device package 500 by the customer.

Leadframe plating, e.g. by applying the first and second metal plating layers 411, 421 or the common metal plating layer 510, has the effect to avoid or slow down electromigration of the leadframe 110 or of any optional leadframe coatings such as, e.g. a Ni coating, a NiP coating or an Au coating, etc. This may be of particular importance for all terminal contacts of the packages 100, 400, 500 which are application board 300 contacts, since Pb free solders are often used for board assembly. As such, the first and second solder joints 311, 321 may, e.g., be made of Pb free solder. As such, AuSn, AgSn, CuSn, AgIn, AuIn, AuGe, CuIn, AuSi, Sn, Au or other solder materials may be used to solder the semiconductor device package 100, 400, 500 to an application board 300.

Figure 8:
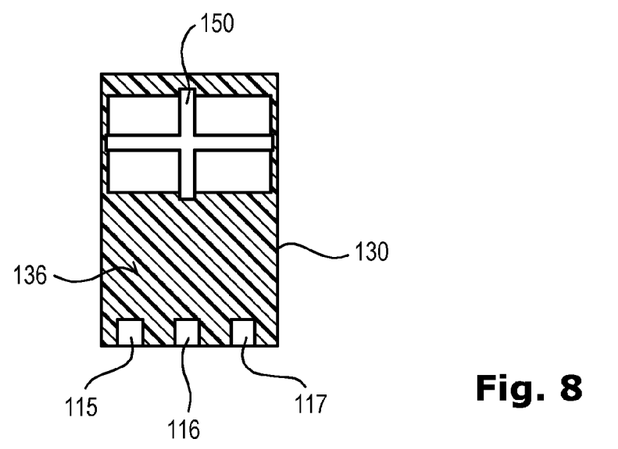
FIG. 8 schematically illustrates a bottom view of an exemplary semiconductor device package having more than 2 leadframe terminal contacts.

FIG. 8 illustrates a bottom view of an exemplary semiconductor device 100, 400, 500 having more than two (in this example e.g. four) I/O terminal contacts. The pattern and geometry of the plurality of I/O terminal contacts is determined by the shape of the covering layer 150. In FIG. 8, as an example, the covering layer 150 has a cross-shaped or mesh-shaped design.

Figures 9, 10:
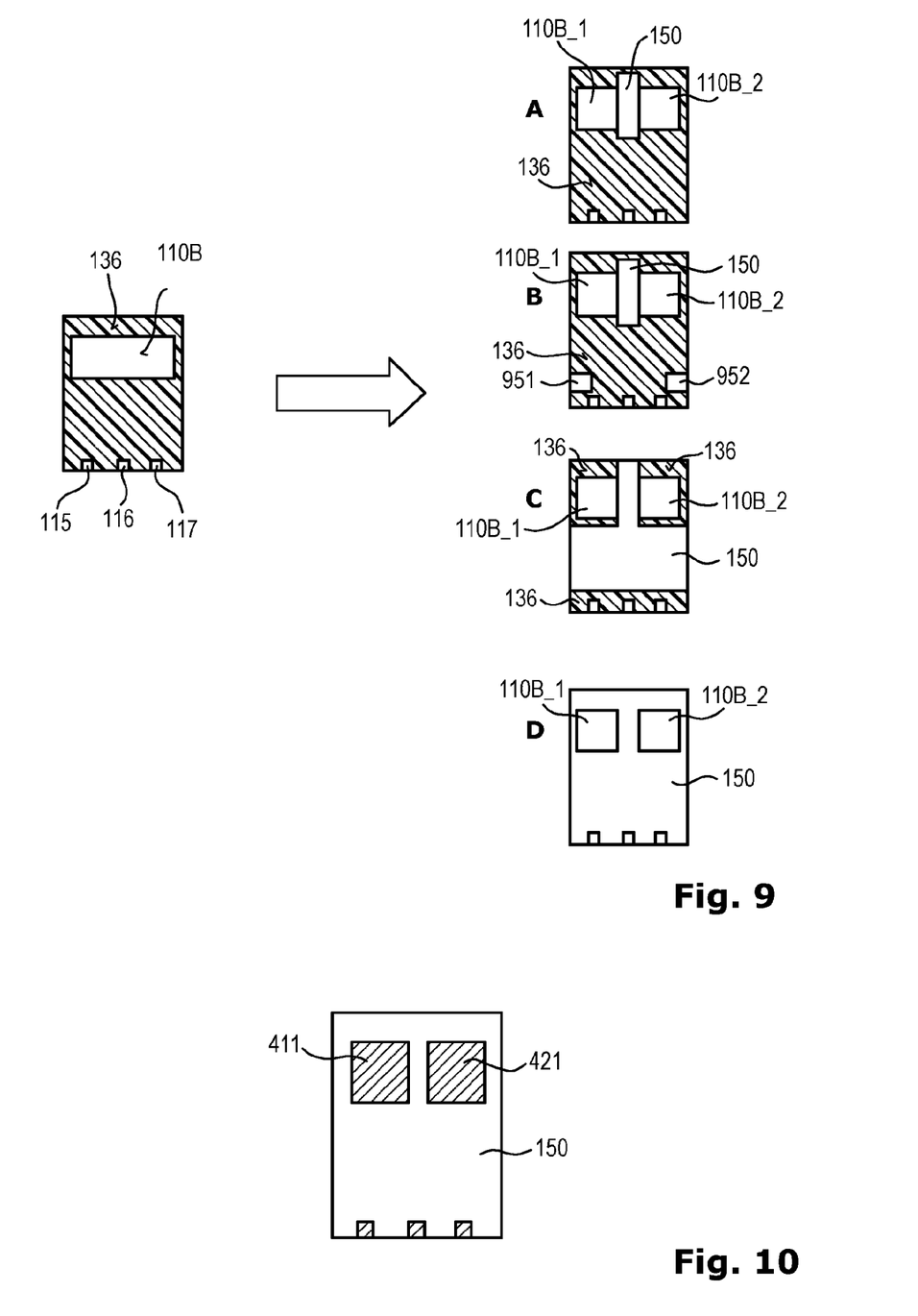
FIG. 9 schematically illustrates bottom views A, B, C and D of exemplary semiconductor device packages having covering layers of different shape.
FIG. 10 schematically illustrates a bottom view of the exemplary semiconductor device packages shown in FIG. 11 or FIG. 12.

FIG. 9 schematically illustrates, on the left-hand side, a bottom view of an exemplary semiconductor device package 100 before the covering layer 150 is applied and, on the right-hand side, exemplary bottom views A, B, C and D of the semiconductor device package 100 after the application of the covering layer 150 or a plurality of structures of different shapes of the covering layer.

Referring to bottom view A, the covering layer 150 extends beyond the outline of the leadframe 110 to also cover a part of the bottom surface 136 of the molded encapsulant 130. The bottom surface 136 of the molded encapsulant 130 may be coplanar with the exposed surface area of the second main surface 110B of the leadframe 110.

Referring to bottom view B, a plurality of additional lands 951, 952 of the covering layer material may be applied on the bottom surface 136 of the molded encapsulant 130. The lands 951, 952 may have the same thickness T as the covering layer 150 and may be applied during the same layer formation process. The lands 951, 952 of covering material may improve or facilitate board assembly of the semiconductor device package 100. They may prevent tilting of the package when placed on the application board 300 or during reflow soldering (board assembly).

The bottom view C illustrates an example in which the covering layer 150, which traverses the exposed surface area of the second main surface 110B of the leadframe 110, further covers a major part or the width of the bottom surface 136 of the molded encapsulant 130. This may further improve the positional stability of the package during placement or reflow soldering.

Bottom view D illustrates an example in which the major part of the bottom surface 136 of the molded encapsulant 130, or even the entire bottom surface 136 thereof, is covered by the covering layer 150. In particular, the covering layer 150 may completely surround the first zone 110B_1 and/or the second zone 110B_2 of the second main surface 110B of the leadframe 110. In particular, the bottom of the semiconductor device package 100 may exclusively be formed by the covering layer 150 and openings of the covering layer 150 for defining the package terminal contacts, e.g. the I/O terminal contacts constituted by the first and second zones 110B_1, 110B_2 and/or the residual package terminal contacts 115, 116, 117 (e.g., ground contact, power supply contacts, control signal contacts, etc.).

While the illustrations in FIGS. 7A-C, 8, 9 exemplarily depict semiconductor device package 100 for ease of explanation, it is to be noted that these examples equivalently apply to semiconductor device packages 400 and 500 having plated I/O terminal contacts. By way of example, FIG. 10 illustrates a bottom view of semiconductor device package 400 or semiconductor device package 500 when applying a covering layer 150 having the same shape as the covering layer 150 shown in view D of FIG. 9. All other bottom views of these Figures analogously translate into corresponding bottom views of plated semiconductor device packages 400 or 500.

Further, semiconductor device packages 100, 400, 500 may be equipped with pre-applied solder deposits attached to the I/O terminal contacts of the package and/or to the residual terminal contacts 115, 116, 117. Using pre-applied solder deposits attached to the package terminal contacts may facilitate board assembly since both the amount and the geometry of the solder deposits may be precisely set by the package manufacturer.

Figure 11:
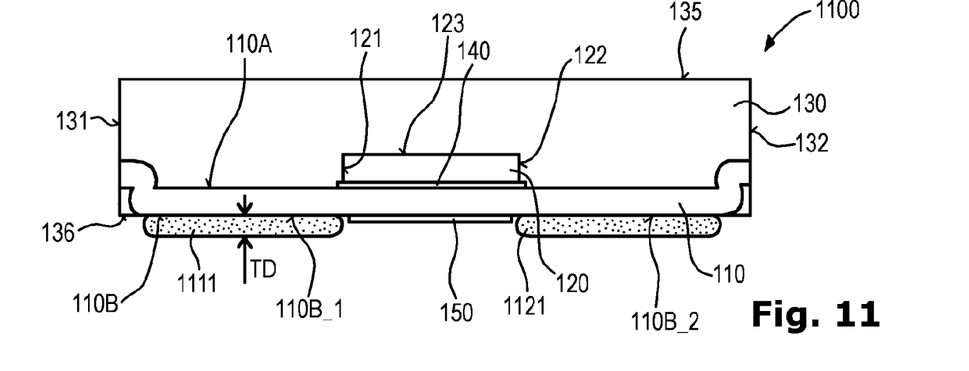
FIG. 11 schematically illustrates a sectional view of the exemplary semiconductor device package of FIG. 1 having solder deposits attached to the leadframe terminal contacts.

Referring to FIG. 11, an exemplary semiconductor device package 1100 may be identical to semiconductor device package 100 except that a first solder deposit 1111 is arranged over the first zone 110B_1 and a second solder deposit 1121 is arranged over the second zone 110B_2. The solder deposits 1111, 1121 may have a thickness TD of equal to or less than or greater than 25 µm, 40 µm, 55 µm, 60 µm, 75 µm, 90 µm, 105 µm.

The first and second solder deposits 1111, 1121 may be attached to the first and second zones 110B_1, 110B_2 by, e.g., a printing process. The first and second solder deposits 1111, 1121 transform to first and second solder joints 311, 321, respectively, when the semiconductor device package 1100 is mounted to an application board 300, e.g. during solder reflow board assembly by the customer.

Figure 12:
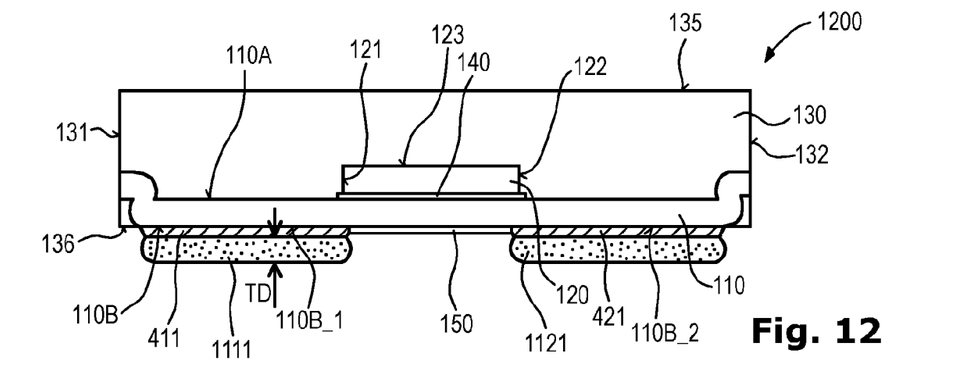
FIG. 12 schematically illustrates a sectional view of the exemplary semiconductor device package of FIG. 4 having solder deposits attached to the metal plating layers.

FIG. 12 illustrates an exemplary semiconductor device package 1200. Semiconductor device package 1200 may be identical to semiconductor package 400 except that solder deposits 1111, 1121 are attached to the (plated) first and second zones 110B_1 and 110B_2, respectively.

Figure 13:
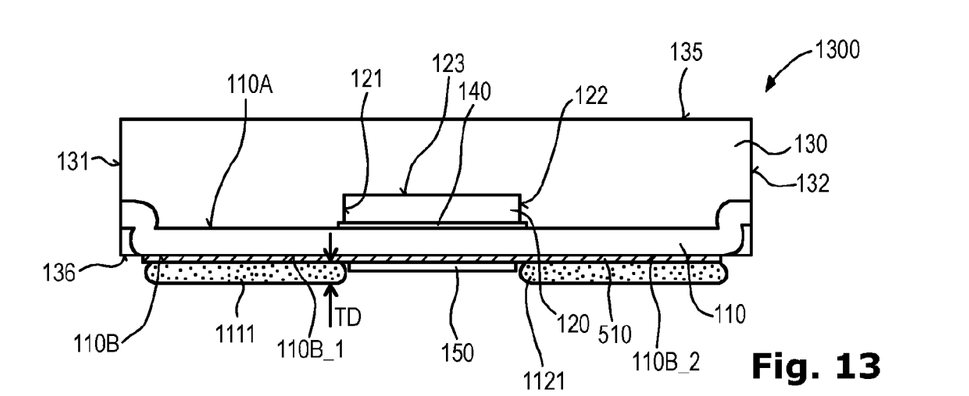
FIG. 13 schematically illustrates a sectional view of the exemplary semiconductor device package of FIG. 5 having solder deposits attached to the metal plating layer.

Analogously, FIG. 13 illustrates an exemplary semiconductor device package 1300, which may be identical to semiconductor device package 500 except that solder deposits 1111, 1121 are attached to the (plated) first and second zones 110B_1 and 110B_2, respectively.

It is to be noted that in all embodiments described herein, the leadframe 110 and, in particular, the second main surface 110B of the leadframe 110 may optionally be coated by a thin coating layer to avoid electromigration of the leadframe 110 as mentioned above. This thin coating layer is not depicted in any of the figures.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

What is claimed is:

1. A semiconductor device package, comprising:
   a leadframe;
   a semiconductor chip mounted to the leadframe;
   a molded encapsulant configured to cast-in-place the leadframe, wherein a surface area of the leadframe is exposed by the encapsulant; and
   an electrically insulating covering layer extending over a part of the surface area and configured to divide the surface area in at least a first zone and a second zone.

2. The semiconductor device package of claim 1, wherein the covering layer is configured to completely traverse the surface area in at least one lateral dimension.

3. The semiconductor device package of claim 1, wherein a portion of the covering layer which traverses the surface area has a shape of a strip, a cross or a mesh.

4. The semiconductor device package of claim 1, wherein the covering layer has a maximum thickness of equal to or less than 30 µm, 20 µm, 10 µm, or 5 µm.

5. The semiconductor device package of claim 1, wherein a portion of the covering layer which traverses the surface area has a minimum width of equal to or greater than 50 µm.

6. The semiconductor device package of claim 1, wherein the first zone defines an input terminal contact of the semiconductor device package and the second zone defines an output terminal contact of the semiconductor device package.

7. The semiconductor device package of claim 1, wherein the leadframe comprises a die pad, the semiconductor chip is mounted to a first surface of the die pad, and the surface area of the leadframe is opposite the first surface of the die pad.

8. The semiconductor device package of claim 1, wherein the semiconductor device package comprises a current sensor.

9. The semiconductor device package of claim 1, wherein the semiconductor chip comprises a magnetic field sensitive element.

10. The semiconductor device package of claim 1, wherein the semiconductor chip comprises a voltage sensing circuitry configured to sense a voltage drop between the at least two zones.

11. The semiconductor device package of claim 1, further comprising:
    a first metal plating layer configured to cover the first zone; and
    a second metal plating layer configured to cover the second zone, wherein the first metal plating layer and the second metal plating layer are laterally separated from each other by the covering layer.

12. The semiconductor device package of claim 1, further comprising:
    a common metal plating layer arranged between the surface area and the covering layer and configured to cover the surface area.

13. The semiconductor device package of claim 1, further comprising:
    a first solder deposit arranged over the first zone; and
    a second solder deposit arranged over the second zone.

14. The semiconductor device package of claim 1, wherein a material of the covering layer is selected from the group consisting of a paint, an ink, a solder resist, a tape, a ceramic, a polymer, a polyimide a silicate and an epoxy, in particular a wafer level epoxy.

15. An arrangement of a semiconductor device package mounted to an application board, the arrangement comprising:
    the semiconductor device package which comprises:
      a leadframe;
      a semiconductor chip mounted to the leadframe;
      a molded encapsulant configured to cast-in-place the leadframe, wherein a surface area of the leadframe is exposed by the encapsulant;
      an electrically insulating covering layer extending over a part of the surface area and configured to divide the surface area in at least a first zone and a second zone; and
    the application board which comprises:
      an input pad, which is electrically connected to the first zone; and
      an output pad, which is electrically connected to the second zone.

16. The arrangement of claim 15, further comprising:
    a first solder joint configured to electrically connect the input pad to the first zone; and
    a second solder joint configured to electrically connect the output pad to the second zone.

17. A method of manufacturing a semiconductor device package, comprising:
    providing a leadframe;
    mounting a semiconductor chip to the leadframe;
    molding an encapsulant configured to cast-in-place the leadframe, wherein a surface area of the leadframe remains exposed by the encapsulant; and
    applying an electrically insulating covering layer extending over a part of the surface area and configured to divide the surface area in at least a first zone and a second zone.

18. The method of claim 17, wherein applying the electrically insulating covering layer is performed by printing, inking, or dispensing.

19. The method of claim 17, further comprising:
    after applying the electrically insulating covering layer, plating a first metal plating layer over the first zone and a second metal plating layer over the second zone.

20. The method of claim 17, further comprising:
    before applying the electrically insulating covering layer, plating a common metal plating layer over the surface area.

* * * * *

UNITED STATES PATENT AND TRADEMARK OFFICE
CERTIFICATE OF CORRECTION

PATENT NO.         : 9,728,493 B2
APPLICATION NO.    : 14/839013
DATED              : August 8, 2017
INVENTOR(S)        : V. Strutz et al.

Page 1 of 1

It is certified that error appears in the above-identified patent and that said Letters Patent is hereby corrected as shown below:

In the Claims

Column 14, Line 15 (Claim 14, Line 4), please change "polyimide a" to -- polyimide, a --.

Signed and Sealed this
Twenty-sixth Day of September, 2017

Joseph Matal
*Performing the Functions and Duties of the*
*Under Secretary of Commerce for Intellectual Property and*
*Director of the United States Patent and Trademark Office*